(12) United States Patent
Chuang

(10) Patent No.: US 8,274,331 B2
(45) Date of Patent: Sep. 25, 2012

(54) DIFFERENTIAL RECEIVER

(75) Inventor: Yu Meng Chuang, Taoyuan (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 13/016,640

(22) Filed: Jan. 28, 2011

(65) Prior Publication Data

US 2012/0194273 A1 Aug. 2, 2012

(51) Int. Cl.
*H03F 3/45* (2006.01)
(52) U.S. Cl. .......................................... 330/253; 330/261
(58) Field of Classification Search .................. 330/253, 330/261
See application file for complete search history.

(56) References Cited

U.S. PATENT DOCUMENTS

| | | | | |
|---|---|---|---|---|
| 6,586,995 B1 * | 7/2003 | Tachibana | ...................... | 330/253 |
| 7,532,071 B2 * | 5/2009 | Miyata | ........................... | 330/255 |
| 7,579,911 B2 * | 8/2009 | Suzuki | ........................... | 330/253 |
| 7,646,241 B2 * | 1/2010 | Lee et al. | ....................... | 330/253 |
| 7,816,989 B2 * | 10/2010 | Yuasa | ........................... | 330/253 |

* cited by examiner

*Primary Examiner* — Henry Choe
(74) *Attorney, Agent, or Firm* — Hamre, Schumann, Mueller & Larson, P.C.

(57) ABSTRACT

A differential receiver includes a first amplifying circuit and a second amplifying circuit. The first amplifying circuit comprises a first differential pair of PMOS transistors, a first current source, and a first load resistance section, while the second amplifying circuit comprises a second differential pair of NMOS transistors, a second current source, and a second load resistance section. With the structure of the first and second amplifying circuits, an increased input common mode range can be obtained.

13 Claims, 5 Drawing Sheets

DIFFERENTIAL RECEIVER

TECHNICAL FIELD

The present invention relates to a differential receiver, and more particularly to a differential receiver for semiconductor memory devices.

BACKGROUND

In semiconductor devices, input receivers are widely used to receive input signals from outside of the semiconductor devices. With recent increases in the operation speed of semiconductor devices, there is a need to increase the sensing speed of input receivers. In the field of memory devices, as the data transfer speed becomes faster, a double data rate (DDR) semiconductor memory device has been developed. The DDR semiconductor memory device employs a rising edge and a falling edge of a clock signal to process data so as to increase the operation speed of memory devices.

FIG. 1 is a circuit diagram illustrating an input receiver 10 used in a DDR semiconductor memory device. Referring to FIG. 1, the input receiver 10 comprises a pre-amplifier 12, a sense amplifier 14, and a latch circuit 16. Pre-amplifier 12 amplifies an input signal IN, from outside of the memory device, with reference to a reference voltage VREF. The pre-amplifier 12 typically comprises a differential pair of PMOS transistors for receiving input signals. Sense amplifier 14 generates an amplified output signal OUT1 and an inverted output signal OUT2 of the pre-amplifier 12 in response to a rising edge of a clock signal CLK (not shown). Latch circuit 16 latches output signal OUT3 and an inverted output signal OUT4 of the sense amplifier 14 so as to generate an output signal OUT and an inverted final output signal OUTB to other circuits in the DDR semiconductor memory device.

Nowadays, DDR semiconductor memory devices are divided into three types: DDR1, DDR2, and DDR3, with maximum operating frequencies of 400 MHz, 800 MHz, and 1.6 GHz, respectively. As the operation frequency of memory devices increase from generation to generation, the prior art input receiver cannot respond immediately, and a waveform distortion results. Furthermore, the input common-mode range of the prior art input receiver is limited and the output common-mode range of the pre-amplifier varies in response to the voltage level of the reference voltage VREF, which affects the performance of the succeeding amplifier stage.

Therefore, there is a need to provide an improved input receiver with an increased input common mode range for high speed applications.

SUMMARY

One aspect of the present invention provides a differential receiver form semiconductor memory devices. In one embodiment of the present invention, the differential receiver comprises a first amplifying circuit and a second amplifying circuit. The first amplifying circuit comprises a first differential pair of PMOS transistors, a first current source, and a first load resistance section. The first differential pair of PMOS transistors is configured to receive first and second input voltages, respectively. The first current source is connected between a supply voltage source and the first differential pair of PMOS transistors. The first load resistance section has an output terminal and an inversion output terminal both connected between a common node and the first differential pair of PMOS transistors. The second amplifying circuit comprises a second differential pair of NMOS transistors, a second current source, and a second load resistance section. The second differential pair of NMOS transistors is configured to receive the first and second input voltages, respectively. The second current source is connected between the common node and the second differential pair of NMOS transistors. The second load resistance section has the output terminal and the inversion output terminal both connected between the supply voltage and the second differential pair of NMOS transistors.

The foregoing has outlined rather broadly the features and technical advantages of the present invention in order that the detailed description of the invention that follows may be better understood. Additional features and advantages of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes as those of the present invention. It should also be realized by those skilled in the art that such equivalent constructions do not depart from the spirit and scope of the invention as set forth in the appended claims.

BRIEF DESCRIPTION OF THE DRAWINGS

The accompanying drawings, which are incorporated in and constitute a part of this specification, illustrate embodiments of the disclosure and, together with the description, serve to explain the principles of the invention.

DETAILED DESCRIPTION

Figure 1:
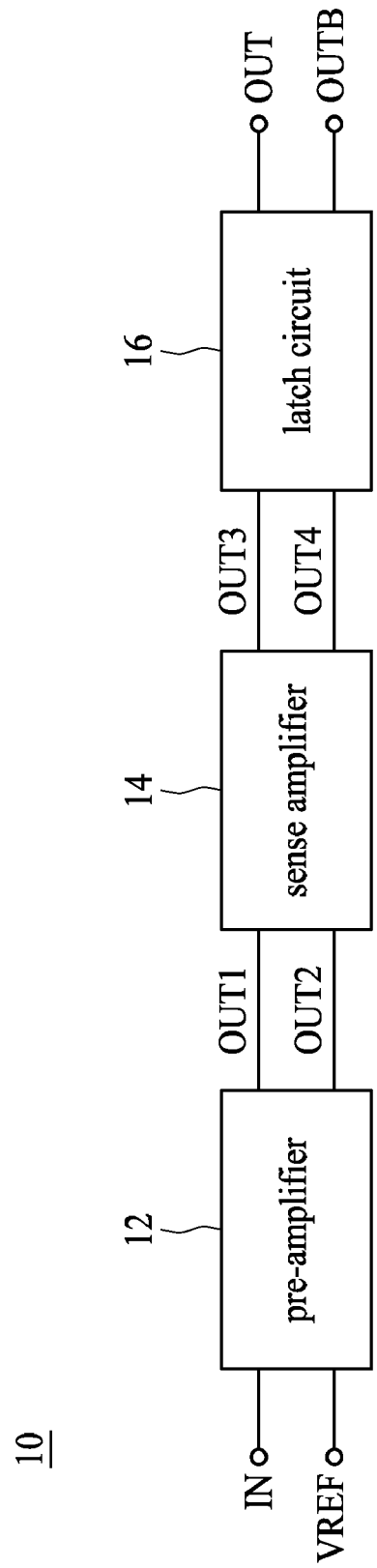
FIG. 1 is a circuit diagram illustrating a prior art input receiver used in DDR semiconductor memory devices.
Figure 2:
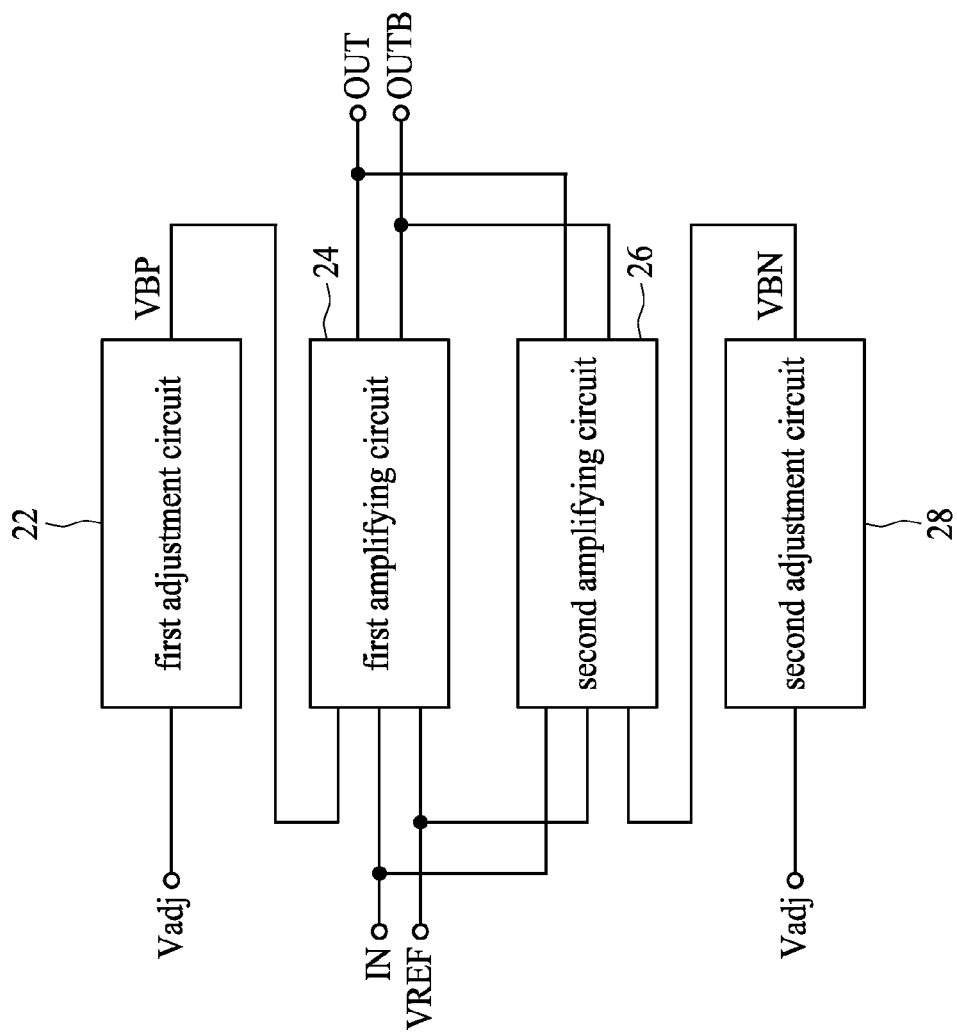
FIG. 2 shows a block diagram of a differential receiver according to one embodiment of the present invention.

FIG. 2 shows a block diagram of a differential receiver 20 according to one exemplary embodiment of the present invention. The differential receiver 20 receives differential input signals at differential positive and negative terminals so as to generate differential output signals. The differential receiver 20 may comprise a succeeding amplifier stage for further amplifying differential output signals. Referring to FIG. 2, the differential receiver 20 comprises a first amplifying circuit 24 and a second amplifying circuit 26 which are electrically connected in parallel.

Figure 3:
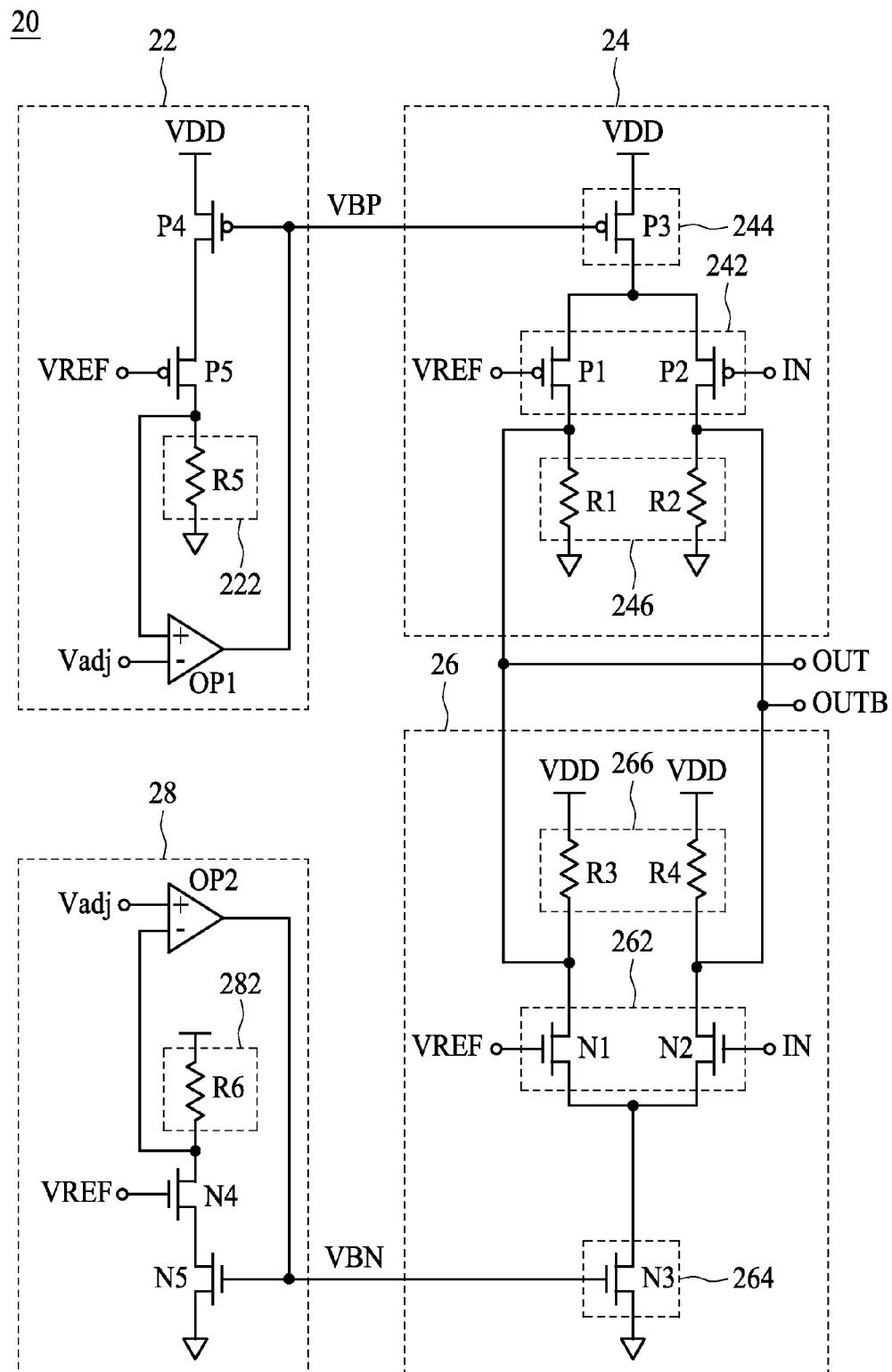
FIG. 3 is a schematic diagram of the differential receiver in accordance with one embodiment of the invention.

FIG. 3 is a schematic diagram of the first amplifying circuit 24 and the second amplifying circuit 26 in accordance with one embodiment of the invention. Referring to FIG. 3, the first amplifying circuit 24 comprises a differential pair 242 of PMOS transistors P1 and P2, a current source 244, and a load resistance section 246. The sources of the PMOS transistors P1 and P2 are connected to each other to constitute the differential pair 242, and the gates of the PMOS transistors P1 and P2 are configured to receive a first input signal VREF and a second input signal IN, respectively.

The current source 244 is connected between a supply voltage source VDD and the differential pair 242. In one embodiment of the present invention, the current source 244 is composed of a PMOS transistor P3 whose source is connected to the supply voltage source VDD and whose drain is connected to the sources of differential pair 242 PMOS transistors P1 and P2. The load resistance section 246 has an output terminal OUT and an output terminal OUTB which has a voltage polarity complement to the output terminal OUT. In one embodiment of the present invention, the load resistance section 246 is composed of two load devices which are implemented as resistors R1 and R2. Referring to FIG. 3, the load resistance section 246 is connected between a ground node and the drains of differential pair 242 PMOS transistors P1 and P2.

The first amplifying circuit 24 and the second amplifying circuit 26 are electrically connected in parallel. Referring to FIG. 3, the second amplifying circuit 26 comprises a differential pair 262 of NMOS transistors N1 and N2, a current source 264, and a load resistance section 266. The sources of the NMOS transistors N1 and N2 are connected to each other to constitute the differential pair 262, and the gates of the NMOS transistors N1 and N2 are configured to receive the first input signal VREF and the second input signal IN, respectively.

The current source 264 is connected between the ground node and the to differential pair 262. In one embodiment of the present invention, the current source 264 is composed of an NMOS transistor N3 whose source is connected to the ground node and whose drain is connected to the sources of differential pair 262 NMOS transistors N1 and N2. The load resistance section 266 has the output terminal OUT and the output terminal OUTB which has a voltage polarity complement to the output terminal OUT. In one embodiment of the present invention, the load resistance section 266 is composed of two load devices, which are implemented as resistors R3 and R4. Referring to FIG. 3, the load resistance section 266 is connected between the supply voltage source VDD and the drains of differential pair 262 NMOS transistors N1 and N2.

The differential receiver 20 amplifies the input signal IN with references to the reference voltage VREF. The output voltages of the differential receiver 20 from the output terminal OUT and the inversion output terminal OUTB can be amplified again by another succeeding amplifier stage (not shown). The output voltages of the differential receiver 20 are a set of voltages that vary at amplitudes with respect to a common mode voltage VCM as a center. That is, the output voltages of the differential receiver 20 are generated such that their average is coincident with the common mode voltage VCM. In order to optimize performance of the succeeding amplifier stage, the output voltages of the differential receiver 20 need to be limited to a certain range. Therefore, an adjustment circuit is required to adjust the common mode voltage VCM.

Referring back to FIG. 2, differential receiver 20 further comprises a first adjustment circuit 22 configured to provide a bias voltage VBP to the first amplifying circuit 24 and a second adjustment circuit 28 configured to provide a bias voltage VBN to the second amplifying circuit 26. The common mode voltage VCM of the output voltages of the differential receiver 20 from the output terminal OUT and the inversion output terminal OUTB can be adjusted by the first and second adjustment circuits 22 and 28.

Referring to FIG. 2, first adjustment circuit 22 receives an adjustable voltage Vadj and generates the bias voltage VBP by controlling the value of the adjustable voltage Vadj. Second adjustment circuit 28 receives the adjustable voltage Vadj and generates the bias voltage VBN by controlling the value of the adjustable voltage Vadj. In one embodiment of the present invention, the first adjustment circuit 22 comprises PMOS transistors P4 and P5, a load device 222, and an amplifier OP1 as shown in FIG. 3. PMOS transistor P4 has a source connected to the supply voltage source VDD, and a gate configured to receive the bias voltage VBP. PMOS transistor P5 has a source connected to a drain of the PMOS transistor P4, and a gate configured to receive the reference voltage VREF. Load device 222 is implemented as a resistor R5 in this embodiment, which has a first terminal connected to a drain of PMOS transistor P5 and a second terminal connected to the ground node. Amplifier OP1 has a negative input terminal configured to receive the adjustable voltage Vadj, a positive input terminal connected to the first terminal of the load device 222, and an output terminal connected to the gate of PMOS transistor P4.

In one embodiment of the present invention, the second adjustment circuit 28 comprises NMOS transistors N4 and N5, a load device 282, and an amplifier OP2 as shown in FIG. 3. Load device 282 is implemented as a resistor R6 in this embodiment, which has a first terminal connected to the supply voltage source VDD. NMOS transistor N4 has a drain connected to a second terminal of the load device 282, and a gate configured to receive the reference voltage VREF. NMOS transistor N5 has a drain connected to a source of the NMOS transistor N4, a gate configured to receive the bias voltage VBN, and a source connected to the ground node. Amplifier OP2 has a positive input terminal configured to receive the adjustable voltage Vadj, a negative input terminal connected to the second terminal of the load device 282, and an output terminal connected to the gate of the NMOS transistor N5.

First and second adjustment circuits 22 and 28 function as a negative feedback circuit. That is, voltages at the positive and negative input terminals of the amplifier OP1 or amplifier OP2 are substantially the same due to the negative feedback mechanism. For example, if the voltage at the positive input terminal of the amplifier OP1 rises above the value of the adjustable voltage Vadj, the output voltage VBP of the amplifier OP1 will decrease. As a result, the bias current of the PMOS transistor P4 is reduced, which lowers the voltage drop of the load device 222. Since the first terminal of the load device 222 is connected to the positive terminal of the amplifier OP1, the voltage at the positive input terminal of the amplifier OP1 is reduced accordingly which compensates for the initial increased voltage at the positive input terminal of the amplifier OP1.

The common mode voltage VCM of the output voltages of the differential receiver 20 from the output terminal OUT and the inversion output terminal OUTB can be adjusted according to a variety of embodiments of the present invention. In one embodiment of the present invention, the common mode voltage VCM is adjusted by controlling the value of the adjustable voltage Vadj. Since the adjustable voltage Vadj controls the current flowing through the PMOS transistor P4 and the value of the current source 244 is proportional to the value of the current flowing through the PMOS transistor P4, varying the voltage Vadj can adjust the value of common mode voltage VCM. Also, varying the ratio of the sizes of the PMOS transistor P4 and the current source 244 can adjust the value of the common mode voltage VCM.

Similarly, the adjustable voltage Vadj controls the current flowing through the NMOS transistor N5, and the value of the current source 264 is proportional to the value of the current flowing through the NMOS transistor N5. Therefore, varying the voltage Vadj can adjust the value of common mode voltage VCM. Also, varying the ratio of the sizes of the NMOS transistor N5 and the current source 264 can adjust the value of the common mode voltage VCM.

In another embodiment of the present invention, since the common mode voltage VCM is the product of the resistance of one of the resistors to R1, R2, R3, and R4 and the value of the current flowing through one of the resistors R1, R2, R3, and R4, the value of the common mode voltage VCM can be adjusted by selecting the resistance of the resistors R1, R2, R3, and R4. In one embodiment, current source 244 is replaced with PMOS transistor P3, and PMOS transistor P3 has a gate length that is the same as the gate length of PMOS transistor P4 and has a gate width that is twice the gate width of PMOS transistor P4. Therefore, the current flowing through PMOS transistor P3 is twice of the current flowing through PMOS transistor P4. Because the current of PMOS device P3 flows equally to the resistors R1 and R2, if the resistance of resistors R1, R2, and R5 are the same, the value of the common mode voltage VCM is substantially the same as the value of the adjustable voltage Vadj.

Similarly, current source 264 is replaced with NMOS transistor N3 in a preferred embodiment, and NMOS transistor N3 has a gate length that is the same as the gate length of NMOS transistor N5 and has a gate width that is twice the gate width of NMOS transistor N5. Therefore, the current flowing through NMOS transistor N3 is twice the current flowing through NMOS transistor N5. Since the current of NMOS device N3 flows equally to the resistors R3 and R4, if the resistance of resistors R3, R4, and R6 are the same, the value of the common mode voltage VCM is substantially the same as the value of the adjustable voltage Vadj.

Figure 4:
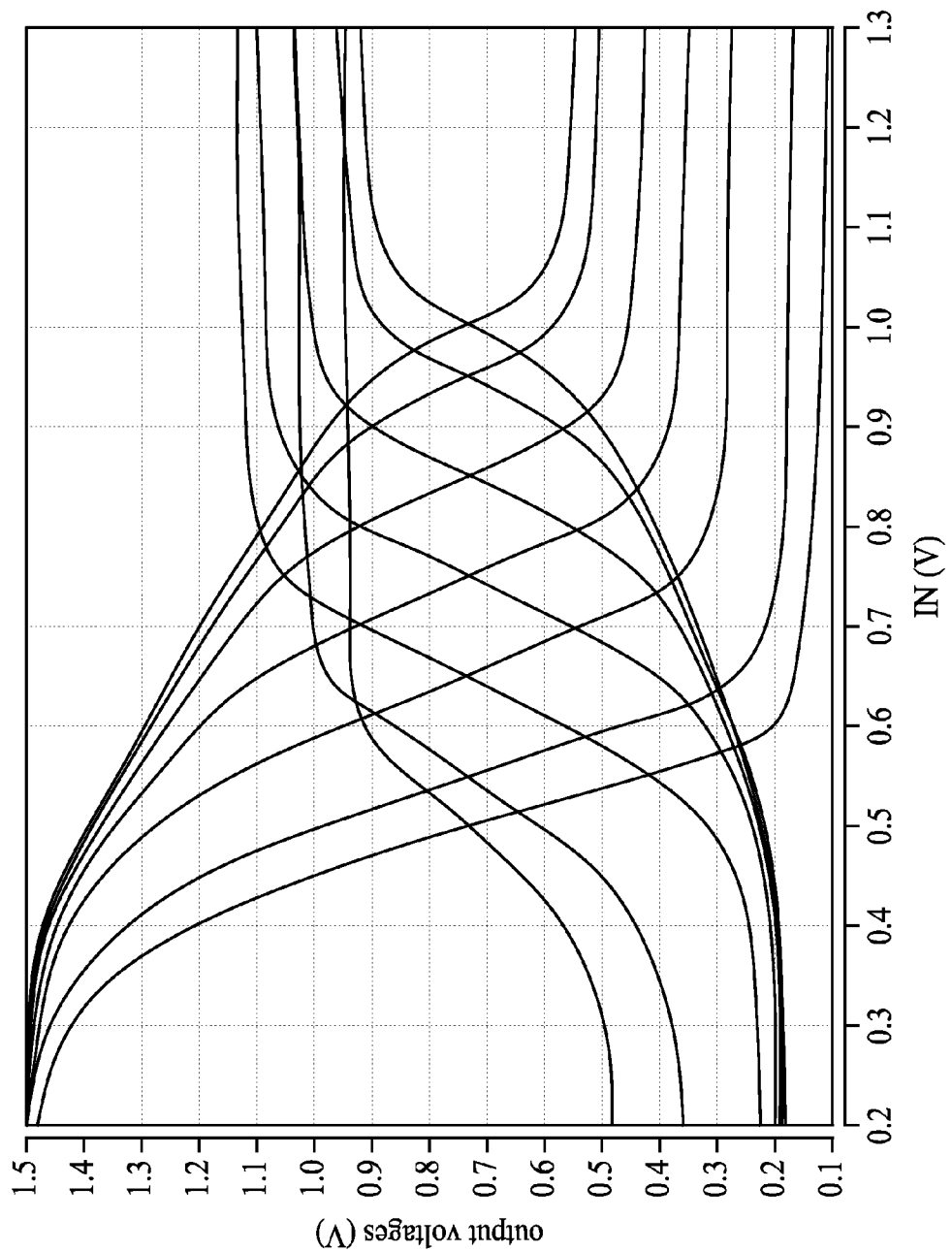
FIG. 4 shows a simulation result of output signals generated at the output terminals of a prior art differential receiver having a differential pair of NMOS transistors.

FIG. 4 shows a simulation result of output signals generated at the output terminals of a prior art differential receiver having a differential pair of NMOS transistors. The simulation is performed by incrementally changing the value of the input voltage IN at a negative input terminal from 0.2V to 1.3V, and the value of the input voltage VREF at a positive input terminal is set to 0.6V, 0.65V, 0.7V, 0.75V, 0.8V, 0.85V, and 0.9V, respectively. Referring to FIG. 4, the output voltages at output terminals of the prior art receiver are non-symmetrical about the common mode voltage level.

Figure 5:
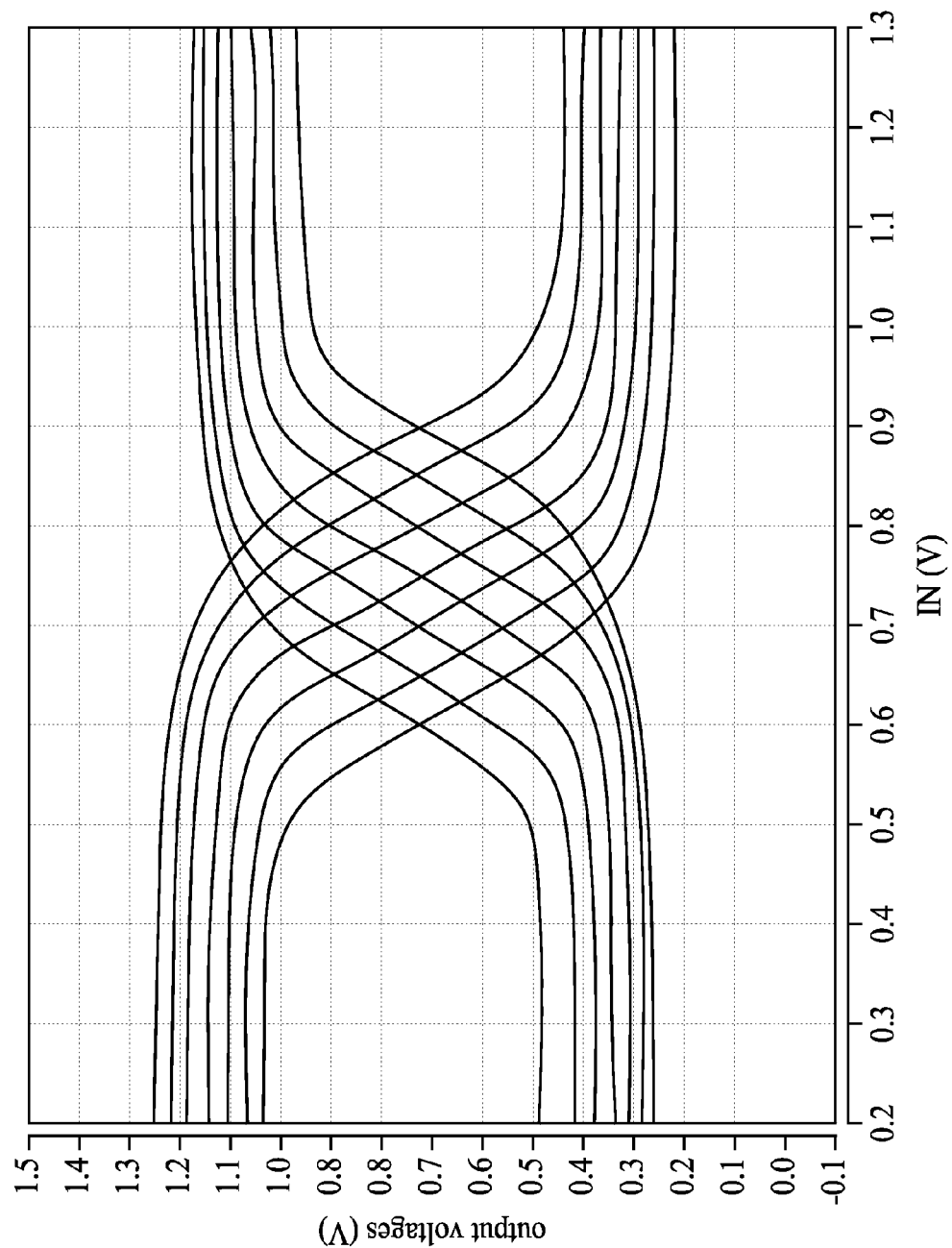
FIG. 5 shows a simulation result of the output signals generated at the output terminals of the differential receiver in accordance with one embodiment of the invention based on the same simulation condition.

On the other hand, FIG. 5 shows a simulation result of the output signals generated at the output terminals based on the same simulation condition of the differential receiver 20 according to one embodiment of the present invention. Referring to FIG. 5, the waveforms of the output voltages have a symmetrical variation during the sweep period. Therefore, the performance of a succeeding amplifier stage can be improved according to the embodiment of the present invention.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

What is claimed is:

1. A differential receiver, comprising:
a first amplifying circuit comprising:
a first differential pair of PMOS transistors configured to receive first and second input voltages;
a first current source connected between a supply voltage source and the first differential pair of PMOS transistors; and
a first load resistance section connected between a common node and the first differential pair of PMOS transistors, wherein nodes between the first differential pair of PMOS transistors and the first load resistance section serve as an output terminal and an inversion output terminal; and
a second amplifying circuit comprising:
a second differential pair of NMOS transistors configured to receive the first and second input voltages;
a second current source connected between the common node and the second differential pair of NMOS transistors; and
a second load resistance section connected between the supply voltage and the second differential pair of NMOS transistors, wherein nodes between the second differential pair of NMOS transistors and the second load resistance section are respectively connected to the output terminal and the inversion output terminal.

2. The differential receiver of claim 1, further comprising a first adjustment circuit and a second adjustment circuit, wherein the first adjustment circuit is configured to provide a first bias voltage to the first amplifying circuit, and the second adjustment circuit is configured provide a second bias voltage to the second amplifying circuit.

3. The differential receiver of claim 2, wherein the first adjustment circuit and the second adjustment circuit receive an adjustable voltage, and the voltages of the output terminal and the inversion output terminal are adjusted by controlling the value of the adjustable voltage.

4. The differential receiver of claim 2, wherein the first adjustment circuit comprises:
a first PMOS transistor having a source connected to the supply voltage, and having a gate configured to receive the first bias voltage;
a second PMOS transistor having a source connected to a drain of the first PMOS transistor, and having a gate configured to receive the first input voltage;
a load device having a first terminal connected to a drain of the second PMOS transistor and a second terminal connected to the common node; and
an amplifier having a positive input terminal configured to receive the adjustable voltage, a negative input terminal connected to the first terminal of the load device, and an output terminal connected to the gate of the first PMOS transistor.

5. The differential receiver of claim 2, wherein the second adjustment circuit comprises:
a load device having a first terminal connected to the supply voltage source;
a first NMOS transistor having a drain connected to a second terminal of the load device, and having a gate configured to receive the first input voltage;
a second NMOS transistor having a drain connected to a source of the first NMOS transistor, having a gate configured to receive the second bias voltage, and having a source connected to the common node; and
an amplifier having a positive input terminal configured to receive the adjustable voltage, a negative input terminal connected to the second terminal of the load device, and an output terminal connected to the gate of the second PMOS transistor.

6. The differential receiver of claim 4, wherein the first load resistance section comprises two load devices which are connected between the common node and the first differential pair of PMOS transistors, and the voltages of the output terminal and the inversion output terminal are adjusted by selecting the value of the two load device and the load device of the first adjustment circuit.

7. The differential receiver of claim 5, wherein the second load resistance section comprises two load devices which are connected between the supply voltage source and the second differential pair of NMOS transistors, and the voltages of the output terminal and the inversion output terminal are adjusted by selecting the value of the two load device and the load device of the second adjustment circuit.

8. The differential receiver of claim 4, wherein the first current source comprises a third PMOS transistor having a source connected to the supply voltage source, a gate connected to the first bias voltage, and a drain connected to the first differential pair of PMOS transistors, and the voltages of the output terminal and the inversion output terminal are adjusted by selecting the size of the third PMOS transistor and that of the first PMOS transistor of the first adjustment circuit.

9. The differential receiver of claim 8, wherein the first load resistance section comprises two load devices which are connected between the common node and the first differential pair of PMOS transistors, the third PMOS transistor has a gate length that is the same as the gate length of the first PMOS transistor and a gate width that is twice the gate width of the first PMOS transistor, and the value of the two load device and the load device of the first adjustment circuit are the same.

10. The differential receiver of claim 5, wherein the second current source comprises a third NMOS transistor having a source connected to the common node, a gate connected to the second bias voltage, and a drain connected to the second differential pair of NMOS transistors, and the voltages of the output terminal and the inversion output terminal are adjusted by selecting the size of the third NMOS transistor and the second NMOS transistor of the second adjustment circuit.

11. The differential receiver of claim 10, wherein the second load resistance section comprises two load devices which are connected between the supply voltage source and the second differential pair of NMOS transistors, the third NMOS transistor has a gate length that is the same as the gate length of the second NMOS transistor and a gate width that is twice the gate width of the second NMOS transistor, and the value of the two load device and the load device of the second adjustment circuit are the same.

12. A differential receiver, comprising:
a first amplifying circuit comprising:
    a first differential pair of PMOS transistors configured to receive first and second input voltages;
    a first current source connected between a supply voltage source and the first differential pair of PMOS transistors;
    a first load resistance section having an output terminal and an inversion output terminal both connected between a common node and the first differential pair of PMOS transistors;
a second amplifying circuit comprising:
    a second differential pair of NMOS transistors configured to receive the first and second input voltages;
    a second current source connected between the common node and the second differential pair of NMOS transistors; and
    a second load resistance section having the output terminal and the inversion output terminal both connected between the supply voltage and the second differential pair of NMOS transistors; and
a first adjustment circuit and a second adjustment circuit, wherein the first adjustment circuit is configured to provide a first bias voltage to the first amplifying circuit, and the second adjustment circuit is configured provide a second bias voltage to the second amplifying circuit;
wherein the first adjustment circuit comprises:
a first PMOS transistor having a source connected to the supply voltage, and having a gate configured to receive the first bias voltage;
a second PMOS transistor having a source connected to a drain of the first PMOS transistor, and having a gate configured to receive the first input voltage;
a load device having a first terminal connected to a drain of the second PMOS transistor and a second terminal connected to the common node; and
an amplifier having a positive input terminal configured to receive the adjustable voltage, a negative input terminal connected to the first terminal of the load device, and an output terminal connected to the gate of the first PMOS transistor.

13. A differential receiver, comprising:
a first amplifying circuit comprising:
    a first differential pair of PMOS transistors configured to receive first and second input voltages;
    a first current source connected between a supply voltage source and the first differential pair of PMOS transistors;
    a first load resistance section having an output terminal and an inversion output terminal both connected between a common node and the first differential pair of PMOS transistors;
a second amplifying circuit comprising:
    a second differential pair of NMOS transistors configured to receive the first and second input voltages;
    a second current source connected between the common node and the second differential pair of NMOS transistors; and
    a second load resistance section having the output terminal and the inversion output terminal both connected between the supply voltage and the second differential pair of NMOS transistors; and
a first adjustment circuit and a second adjustment circuit, wherein the first adjustment circuit is configured to provide a first bias voltage to the first amplifying circuit, and the second adjustment circuit is configured provide a second bias voltage to the second amplifying circuit;
wherein the second adjustment circuit comprises:
a load device having a first terminal connected to the supply voltage source;
a first NMOS transistor having a drain connected to a second terminal of the load device, and having a gate configured to receive the first input voltage;
a second NMOS transistor having a drain connected to a source of the first NMOS transistor, having a gate configured to receive the second bias voltage, and having a source connected to the common node; and
an amplifier having a positive input terminal configured to receive the adjustable voltage, a negative input terminal connected to the second terminal of the load device, and an output terminal connected to the gate of the second PMOS transistor.

* * * * *